(12) United States Patent
Palgy et al.

(10) Patent No.: US 10,574,265 B2
(45) Date of Patent: Feb. 25, 2020

(54) TRANSMITTING AND RECEIVING DATA USING POLAR CODES

(71) Applicant: TCL Communication Limited, Kowloon (HK)

(72) Inventors: Michal Palgy, Colombes (FR); Guang Liu, Colombes (FR); Roy Ron, Colombes (FR); Efstathios Katranaras, Colombes (FR)

(73) Assignee: TCL COMMUNICATION LIMITED, Kowloon (HK)

( * ) Notice: Subject to any disclaimer, the term of this patent is extended or adjusted under 35 U.S.C. 154(b) by 55 days.

(21) Appl. No.: 15/971,816

(22) Filed: May 4, 2018

(65) Prior Publication Data

US 2018/0323803 A1 Nov. 8, 2018

(30) Foreign Application Priority Data

May 5, 2017 (GB) .................................. 1707267.9
May 8, 2017 (GB) .................................. 1707278.6

(51) Int. Cl.
| | |
|---|---|
| *H03M 13/13* | (2006.01) |
| *H04L 1/00* | (2006.01) |
| *H03M 13/00* | (2006.01) |
| *H03M 13/09* | (2006.01) |

(52) U.S. Cl.
CPC ......... *H03M 13/13* (2013.01); *H03M 13/618* (2013.01); *H03M 13/6362* (2013.01); *H04L 1/0041* (2013.01); *H04L 1/0057* (2013.01); *H03M 13/09* (2013.01); *H04L 1/0061* (2013.01)

(58) Field of Classification Search
CPC ... H04L 1/0009; H04L 1/0041; H04L 1/0057; H04L 1/0061; H03M 13/13; H03M 13/618; H03M 13/6362; H03M 14/6362
See application file for complete search history.

(56) References Cited

U.S. PATENT DOCUMENTS

2013/0111291 A1* 5/2013 Ma ........................ H04L 1/0009
714/752
2018/0324864 A1* 11/2018 Jung ..................... H04W 24/10

OTHER PUBLICATIONS

AT&T: Design features of Polar codes for control channels, Apr. 2017, 3GPP TSG Ran WG1 meeting #88bis, R1-1704351, pp. 1 to 3.*
Sequans Communications: Discussion on SS time index indication, Mar. 2017, 3GPP Draft; R1-1704599, pp. 1 to 5.*
Stimming et al., LLR-Based successive cancellation list decoding of polar codes, Oct. 2015, IEEE trans. on signal processing, vol. 63, No. 19, pp. 5165 to 5179.*

* cited by examiner

*Primary Examiner* — Shelly A Chase
(74) *Attorney, Agent, or Firm* — Baker & Hostetler LLP

(57) ABSTRACT

Methods and apparatus for transmitting and receiving data over a physical channel using a polar code are provided. The polar code defines a plurality of virtual channels within the physical channel and allocates a subset of the virtual channels for the transmission of data. The method for transmitting data: receives a block of data to be transmitted; receives additional data to be transmitted together with the block of data; selects one or more of the virtual channels; determines a scrambling sequence based on the additional data; applies the scrambling sequence to those bits of the block of data to generate a scrambled version of the block of data; and transmits the scrambled version of the block of data according to the polar code.

20 Claims, 12 Drawing Sheets

TRANSMITTING AND RECEIVING DATA USING POLAR CODES

CROSS-REFERENCE TO RELATED APPLICATIONS

This application claims priority to foreign Great Britain patent application Nos. GB 1707267.9, filed on May 5, 2017 and GB 1707278.6, filed on May 8, 2017, the disclosures of which are incorporated by reference in their entirety.

TECHNICAL FIELD

The present disclosure relates to the transmission and receipt of data using Polar codes. In particular, it relates to the implicit transmission and receipt of additional data alongside a block of data which is transmitted or received.

BACKGROUND

Wireless communications systems, such as the third-generation (3G) of mobile telephone standards and technology are well known. Such 3G standards and technology have been developed by the Third Generation Partnership Project (3GPP). The 3rd generation of wireless communications has generally been developed to support macro-cell mobile phone communications. Communication systems and networks have developed towards a broadband and mobile system.

The $3^{rd}$ Generation Partnership Project has developed the so-called Long Term Evolution (LTE) system, namely, an Evolved Universal Mobile Telecommunication System Territorial Radio Access Network, (E-UTRAN), for a mobile access network where one or more macro-cells are supported by a base station known as an eNodeB or eNB (evolved NodeB). More recently, LTE is evolving further towards the so-called 5G or NR (new radio) systems where one or more cells are supported by a base station known as a gNB (generalized NodeB).

In 3GPP there is a continual search for agreements on the implementation of new and relevant features for NR systems. The agreements are relevant to many options. One option of interest relates to the use of Polar coding for the eMBB (enhanced Mobile Broadband) UL/DL control channels. According to this option, CRC (cyclic redundancy check) codes will be utilized either within the coded block or external in another coded block in the case of concatenated polar codes. These CRC codes may be used to provide error detection for the blocks of data being transmitted and, in some implementations may also enable error correction.

Polar codes in 5G have been proven to achieve capacity by code construction for binary erasure channel (BEC). Encoding complexity is of O(Nlog2N) for a code block size N. Decoding complexity is of O(Nlog2N) with a successive cancellation (SC) decoder, and higher with more advanced decoder with better performance such as a List decoder O(LNlog2n). The implementation complexity of list decoder increases with increasing list size, especially with large block size. Furthermore, Polar codes are not parallelizable as Turbo and LDPC, and latency requirements for large block-lengths are questionable. However, Polar codes have been shown to outperform Turbo code and LDPC for short-block lengths with no error floor for List decoder, as NR control channel requires ultrareliability transmission.

In a communications system, encoding is generally used to improve the reliability of data transmission. The polar code is a linear block code which can provably achieve the Shannon capacity for a binary erasure channel with low complexity of encoding-decoding. Conceptually, polar codes split a physical channel up into a number of virtual channels. The reliability of each of the virtual channels (i.e. the likelihood of a bit transmitted on that channel will be successfully received) defined by a polar code differs from each other. However, generally, as the number of virtual channels defined by a polar code increases (e.g. as N goes to infinity), the reliability of each of the channels polarizes to become either very reliable (e.g. a perfect channel with capacity 1) or very unreliable (e.g. a useless channel with capacity 0). The virtual channels with the highest reliability are chosen for the transmission of information bits, whilst the other virtual channels are "frozen" and are not used for the transmission of information bits. The positions of data and frozen bits change with the polar code construction parameter ⍰ for the same code block size. Both the encoder and the decoder must utilize same locations of the frozen bits for a successful decoding meaning they should know either parameter ⍰ for code construction or a pre-defined set of frozen locations which is the outcome of the code construction.

As illustrated in FIG. 1, a polar code 120 of size N (whereby N=8 in FIG. 1) is generated by duplicating and combining n times the constructed transform starting from duplicating and combining the basic transform 110, to give N virtual channels, where $N=2^n$. It should be noted that the symbol ⊕, as used in FIG. 1, represents the exclusive OR (XOR) operation. Of these channels, the four channels having the highest reliability are indicated as being "data" channels, whilst the four channels having the lowest reliability are indicated as being "frozen" channels, for a code rate R=½.

Various agreements have been made in this technical area, for example:—

Agreement:
  J CRC bits are provided (which may be used for error detection and may also be used to assist decoding and potentially for early termination)
    J may be different in DL and UL
    J may depend on the payload size in the UL (0 not precluded)
  In addition, J' assistance bits are provided in reliable locations (which may be used to assist decoding and potentially for early termination)
  J+J'<=the number of bits required to satisfy the FAR target $(n_{FAR})$+6
    Working assumption:
      For DL, $n_{FAR}$=16 (at least for eMBB-related DCI)
      For UL, $n_{FAR}$=8 or 16 (at least for eMBB-related UCI;
    note that this applies for UL cases with CRC)
    J'>0
    Working assumption: J"<=2 additional assistance bits are provided in unreliable locations (which may be used to assist decoding and potentially for early termination)
      Can be revisited in RAN1#89 if significant benefit is shown from a larger value of J" without undue complexity—companies are encouraged to additionally evaluate J"=8
  The J' (and J" if any) bits may be CRC and/or PC and/or hash bits (downscope if possible)
  Placement of the J, J' (and J" if any) assistance bits is FFS after the study of early termination techniques
    Appended?

Distributed?
  evenly?
  unevenly?
Agreements (for very small block lengths):
  K=1 (if channel coding is applied):
    Repetition code
  K=2 (if channel coding is applied):
    Simplex code
  3<=K<=11:
    LTE RM code
      Note that if NR requires a codeword size N that is not supported by the LTE RM code, then the LTE RM code will be extended by repetition as in LTE
  12<=K:
    Polar code (single design for all control information sizes, except for possible omission of CRC bits for payloads <=-22 bits)
Agreement for DCI:
  Maximum mother code size of Polar code, N=2n, is:
    Nmax,DCI=512 for downlink control information
Working Assumption for UCI:
  Nmax,UCI=1024
    Optimise code design for K up to 200
      Also aim for code design that supports values of K up to 500 with good performance, typically using higher code rates
  Without prejudice to the final design, companies are encouraged to investigate advanced code rate matching schemes until RAN1#88bis
  Working assumption can be revisited at RAN1#88bis if it does not prove to be possible to generate a good code design with Nmax, UCI=1024
Agreements:
  Performance metrics (may be based on analytic derivation)
    BLER
    FAR (with AWGN as input to the decoder)
  Polar codes for control channels support one of the following alternatives:
    Alt. 1: CRC+"basic polar" (i.e. as per above agreed description) codes
      1a: Longer CRC
    e.g. (J+J') bits CRC+basic polar
      1b: J bit CRC
        The J bits can be distributed
        The CRC can be used for both error detection and error correction
    Alt. 2: J bits CRC+concatenated polar codes
      e.g. J bits CRC+J' bits CRC+basic polar;
        J bits CRC+J' bits distributed CRC+basic polar;
        J bits CRC+PC bits+basic polar; (i.e. PC-Polar)
        J bits CRC+Hash sequence+basic polar;
        . . .
        J bits CRC is only used for error detection
  Polar coding is adopted for eMBB UL/DL control channels (LPDC was adopted as the coding scheme for eMBB UL/DL data channels). Coding scheme(s) for URLLC and mMTC is not yet defined.
  Polar code will utilize CRC, either within the coded block or externally in another coded block in case of concatenated polar codes.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present invention relates to communication systems which use Polar codes, such as 5G/NR. The invention provides a way to implicitly signal additional information, such as control information, using the Polar code without increasing the coding rate. Alternatively, the invention provides a way to decrease the Polar coding rate without decreasing the amount of transmitted information. The code rate has a direct influence on the block error rate (BLER) performance that improves with lower code rates.

According to a first aspect of the invention, there is provided a method for transmitting data over a physical channel using a polar code. The polar code defines a plurality of virtual channels within the physical channel. The polar code also allocates a subset of the virtual channels for the transmission of data. The polar code maps the subset of virtual channels for the transmission of data to respective bits of a block of data which is to be transmitted. The method receives a block of data to be transmitted. The method further receives additional data to be transmitted together with the block of data. The method selects one or more of the virtual channels which are allocated for the transmission of data as being channels for transmitting the additional data. The method determines a scrambling sequence based on the additional data. The method applies the scrambling sequence to those bits of the block of data which map onto the one or more virtual channels for transmitting the additional data to generate a scrambled version of the block of data. The method transmits the scrambled version of the block of data according to the polar code, wherein error detection data is also transmitted which enables the detection of errors in the block of data.

Since the scrambling sequence (or code) is based on the additional data which is to be transmitted, the application of the scrambling sequence to the bits of the block of data which are transmitted on one or more of the subset of channels which are allocated for the transmission of data enables additional data to be implicitly indicated to a receiver. This means that the mother code rate of a Polar code can be effectively decreased, leading to better BLER performance, or equivalently higher spectral efficiency which may help a network to improve resource utilization. Furthermore, the additional data can be implicitly transmitted without significantly increasing the encoding or decoding complexity of the polar code.

The method may receive the error detection data for the block of data. The block of data that is received may comprise the error detection data (i.e. the error detection data is received as part of the block of data that is received). However, the error detection data may be received separately from the block of data. Alternatively, the method may generate the error detection data for the block of data.

The scrambled version of the block of data may comprise the error detection data (i.e. the error detection may be transmitted as part of the scrambled version of the block of data). Alternatively, the method may transmit the error detection separately from the scrambled version of the block of data.

The error detection data may comprise a cyclic redundancy check (CRC) code.

The selection of the one or more virtual channels for transmitting the additional data may be based, at least in part, on the respective reliabilities of the one or more virtual channels.

The method may select one or more virtual channels having a highest reliability amongst the one or more virtual channels allocated for the transmission of data as channels for transmitting the additional data.

The method may select one or more virtual channels having a reliability which exceeds a predetermined threshold as channels for transmitting the additional data.

By selecting the channels for transmitting the additional data based on the respective reliabilities of the virtual channels, the method can reduce the likelihood of false positives occurring at the receiver.

The polar code block size may be smaller than the size of the received block of data and the additional data may comprise those bits of the received block of data which are not mapped onto virtual channels by the polar code. In other words, the method may be used to transmit a larger block of data than the polar code block size allows by splitting the larger block of data into a first part which fits the polar code block size and a second part containing the remaining data which is to be implicitly transmitted by the method as the additional data.

The scrambling sequence may be selected from one or more distinct scrambling sequences, each distinct scrambling sequence being associated with a different value for the additional data. In other words, where there are a number of different possible values which the additional data may take, a distinct scrambling sequence can be provided to represent each different possible value. For example, if the additional data can be any arbitrary 3-bit binary string, 8 ($2^3$) distinct scrambling sequences may be provided, each scrambling sequence being associated with a different possible 3-bit binary string. As such, a first distinct scrambling sequence may represent the binary string "000", whilst a second distinct scrambling sequence may represent the binary string "001" and so on.

The one or more distinct scrambling sequences comprise a scrambling sequence which is associated with an ACK in UCI and a scrambling sequence which is associated with a NACK in UCI. It will be appreciated that the one or more distinct scrambling sequences may comprise multiple ACK/NACKs indications, for example for two TBs with 2 ACK/NACK indications accordingly, or for multiple CBGs (Code Block Groups) with multiple ACK/NACK represented as a compressed stream.

The one or more distinct scrambling sequences may comprise scrambling sequences which are associated with SS block time index indication by PBCH.

The number of channels which are selected for transmitting the additional data, s, may be equal to log 2K rounded up to the next integer value (i.e. s=⌈$\log_2 K$⌉), wherein K is the number of distinct scrambling sequences from which the scrambling sequence is selected. This provides a minimum number.

The number of channels which are selected for transmitting the additional data, s, may be greater than log 2K rounded up to the next integer value (i.e. s ⌈$\log_2 K$⌉), wherein K is the number of distinct scrambling sequences from which the scrambling sequence is selected.

The distinct scrambling sequences may be selected so as to maximise Hamming distances between each of the distinct scrambling sequences for a given number of virtual channels which are selected for transmitting the additional data. The length of the scrambling sequences is determined by the number of virtual channels which are selected for transmitting the additional data. There is a trade-off for selecting the right number of channels for transmitting the additional data. Whilst using a smaller number s of virtual channels for transmitting the additional data will mean that the reliability of the virtual channels will be higher, using a larger number s of virtual channels for transmitting the additional data allows greater Hamming distances to exist between each of the distinct scrambling sequences. The false-positive-error rate decreases both with higher reliability of selected channels and with greater Hamming distances between the distinct scrambling sequences.

The method may comprise determining number of channels which are selected for transmitting the additional data to minimise the false positive error rate.

The scrambling sequence may comprise the additional data.

The additional data may comprise data which is already known to a receiver of the transmitted data. The additional data may comprise a cell ID associated with a cell in a mobile network.

The additional data may comprise an RNTI, or a part of the RNTI.

The additional data may comprise repeated data which has previously been transmitted. The additional data may comprise puncturing information in URLLC/eMBB multiplexing.

The polar code may be constructed according to a polar code construction parameter ¾ which is equal to 1−R, wherein R equals the number D of virtual channels for the transmission of data divided by the remaining number of virtual channels which are not allocated to the transmission of data. This allows the optimal re-construction of the polar code when the code rate is reduced relative to scenarios in which all information is explicitly transmitted and gives D=ceil(N*R) data bits and F=floor(N*(1−R)) frozen bits, or alternatively D=floor(N*R) data bits and F=ceil(N*(1−R)) frozen bits.

According to a second aspect of the invention, there is provided a method for receiving data over a physical channel using a polar code. The polar code defines a plurality of virtual channels within the physical channel. The polar code also allocates a subset of the virtual channels for the transmission of data. The polar code maps the subset of virtual channels for the transmission of data to respective bits of a block of data being transmitted. The method receives a scrambled version of a block of data, wherein error detection data is also received which enables the detection of errors in the block of data. The method identifies one or more of the virtual channels which are allocated for the transmission of data as being channels on which additional data has been transmitted, wherein the scrambled version of the block of data is formed by scrambling the bits of the block of data which were transmitted on those channels using a scrambling sequence which is based on the additional data. The method generates one or more hypotheses as to the scrambling sequence which has been applied to the channels on which the additional data has been transmitted. The method tests each of the one or more hypotheses to identify a correct hypothesis by descrambling the scrambled version of the block of data according to each hypothesis and using the error detection data to determine whether any errors are present in the descrambled block of data, wherein the correct hypothesis is one for which no errors are present in the descrambled block of data. The method determines the additional data that has been transmitted based on the correct hypothesis of the scrambling sequence that has been applied to the channels on which the additional data has been transmitted.

Since an error detection code is received for the block of data for which a scrambled version is received, the receiver can test different hypotheses as to the scrambling sequence which was used to scramble one or more bits of the block of data to generate the scrambled version of the block of data. This is because, assuming that no errors occur during transmission (and, of course, assuming that there are no false alarms caused by collisions in the error detection code—however, a 16-bit CRC will have a false alarm rate of $2^{-16}$ making false alarms from the error detection code itself unlikely), only a correct hypothesis as to the scrambling sequence used to scramble the block of data will produce a block of data which does not contain any errors when that scrambling sequence is used to descramble the scrambled version of the block of data. The receiver can therefore test whether a hypothesis is correct by descrambling the data using the hypothesised scrambling code and using the error detection code to determine whether the descrambled block of data contains any errors. Since the scrambling code is determined based on the additional data that is implicitly transmitted, the receiver can use the correct hypothesis to determine the additional data. Whilst errors introduced during transmission may result in a false positive for a hypothesis being tested, the operation of the polar code serves to reduce the likelihood of this happening since the channels which are allocated for the transmission of data, to which the scrambling code is applied, are in general more reliable. Furthermore, the additional data can be implicitly transmitted without significantly increasing the encoding or decoding complexity of the polar code.

The error detection data may be received separately from the scrambled version of the block of data. The scrambled version of the block of data may comprise the error detection data (i.e. the error correction data may be received as part of the scrambled version of the block of data).

The error detection data may comprise a cyclic redundancy check (CRC) code.

The identification of the one or more virtual channels on which additional data has been transmitted is based, at least in part, on the respective reliabilities of the one or more virtual channels.

The identification of the one or more virtual channels on which additional data has been transmitted may comprise identifying one or more virtual channels having a highest reliability amongst the one or more virtual channels allocated for the transmission of data.

The identification of the one or more virtual channels on which additional data has been transmitted comprise identifying one or more virtual channels having a reliability which exceeds a predetermined threshold.

Generating the one or more hypotheses as to the scrambling sequence which has been applied to the channels on which the additional data has been transmitted may comprise generating a hypothesis for each of one or more distinct scrambling sequences, each distinct scrambling sequence being associated with a different value for the additional data.

The one or more distinct scrambling sequences may comprise a scrambling sequence which is associated with an ACK in UCI and a scrambling sequence which is associated with a NACK in UCI. It will be appreciated that the one or more distinct scrambling sequences may comprise multiple ACK/NACKs indications, for example for two TBs with 2 ACK/NACK indications accordingly, or for multiple CBGs (Code Block Groups) with multiple ACK/NACK represented as a compressed stream.

The one or more distinct scrambling sequences comprise scrambling sequences which are associated with SS block time index indication by PBCH.

The number of channels which are identified as being channels on which additional data, s, has been transmitted may be equal to log 2 K rounded up to the next integer value (i.e. s [log 2K]), wherein K is the number of distinct scrambling sequences for which hypotheses are generated.

The number of channels, s, which are identified as being channels on which additional data has been transmitted may be greater than log 2 K rounded up to the next integer value (i.e. s [$\log_2$K]), wherein K is the number of distinct scrambling sequences for which hypotheses are generated.

The distinct scrambling sequences may be selected so as to maximise Hamming distances between each of the distinct scrambling sequences for a given number of virtual channels which are identified as being channels on which additional data has been transmitted. As discussed above, there is a trade-off for the right number of channels on which the additional data is transmitted. Whilst using a smaller number s of virtual channels for transmitting the additional data will mean that the reliability of the virtual channels will be higher, using a larger number s of virtual channels for transmitting the additional data allows greater Hamming distances to exist between each of the distinct scrambling sequences. The false-positive-error rate decreases both with higher reliability of selected channels and with greater Hamming distances between the distinct scrambling sequences.

The method may further comprise determining the number of channels which are identified as being channels on which additional data has been transmitted to minimise the false positive error rate.

Generating one or more hypotheses as to the scrambling sequence which has been applied to the channels on which the additional data has been transmitted may comprise generating a prediction of the additional data which has been transmitted and generating a scrambling sequence which comprises the predicted additional data.

The prediction of the additional data is generated based on data which already known to the receiver. This enables the receiver to check that the data which the receiver already has is correct, thereby improving robustness and reliability of the system.

The prediction of the additional data comprises a cell ID associated with a cell in a mobile network. The additional data may comprise an RNTI, or a part of the RNTI.

The additional data may comprise repeated data which has previously been transmitted and the method may further comprise determining whether the repeated data matches the data which has previously been received. This enables the receiver to check that data which has been received previously is correct, improving the robustness and reliability of the system.

The repeated data may comprise an ACK/NACK indication in UCI.

The additional data may comprise puncturing information in URLCC/eMBB multiplexing.

The polar code may be constructed according to a polar code construction parameter ¾ which is equal to 1−R, wherein R equals the number D of virtual channels for the transmission of data divided by the remaining number of virtual channels which are not allocated to the transmission of data. This allows the optimal re-construction of the polar code when the code rate is reduced relative to scenarios in which all information is explicitly transmitted.

According to a third aspect of the invention, there is provided an apparatus which is configured to either transmit data over a physical channel according to the first aspect of the invention, receive data over a physical channel according to the second aspect of the invention, or both. For example, the apparatus may comprise a processor and a transmitter and/or receiver, wherein the processor is adapted to carry out the method of the first and/or second aspects of the invention to cause the transmitter and/or receiver to transmit and/or receive the data over the physical channel.

The apparatus may be a base station in a mobile network. The apparatus may be a mobile device in a mobile network.

According to a fourth aspect of the invention, there is provided a mobile network comprising one or more base stations and one or more mobile devices according to the third aspect of the invention.

According to a fifth aspect of the invention, there is provided a non-transitory computer readable medium having computer readable instructions stored thereon for execution by a processor to perform a method according to the first and second aspects of the invention.

The non-transitory computer readable medium may comprise at least one from a group consisting of: a hard disk, a CD-ROM, an optical storage device, a magnetic storage device, a Read Only Memory, EPROM, and Electrically Erasable Programmable Read Only Memory and a Flash memory.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Those skilled in the art will recognise and appreciate that the specifics of the examples described are merely illustrative of some embodiments and that the teachings set forth herein are applicable in a variety of alternative settings.

Figure 1:
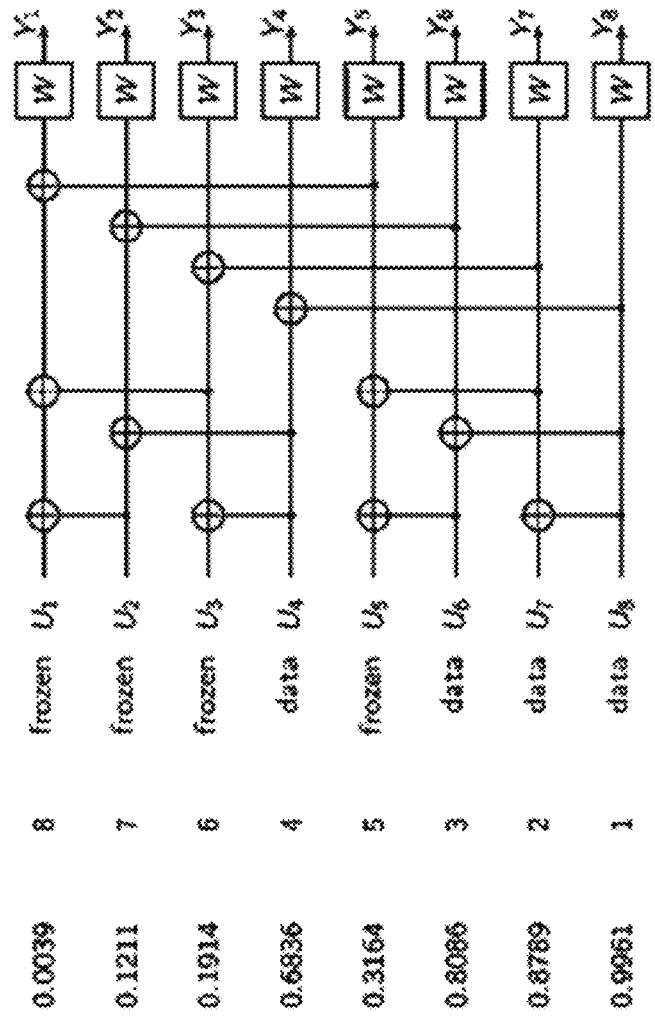
FIG. 1 shows the construction of a Polar code of size N.
Figure 2:
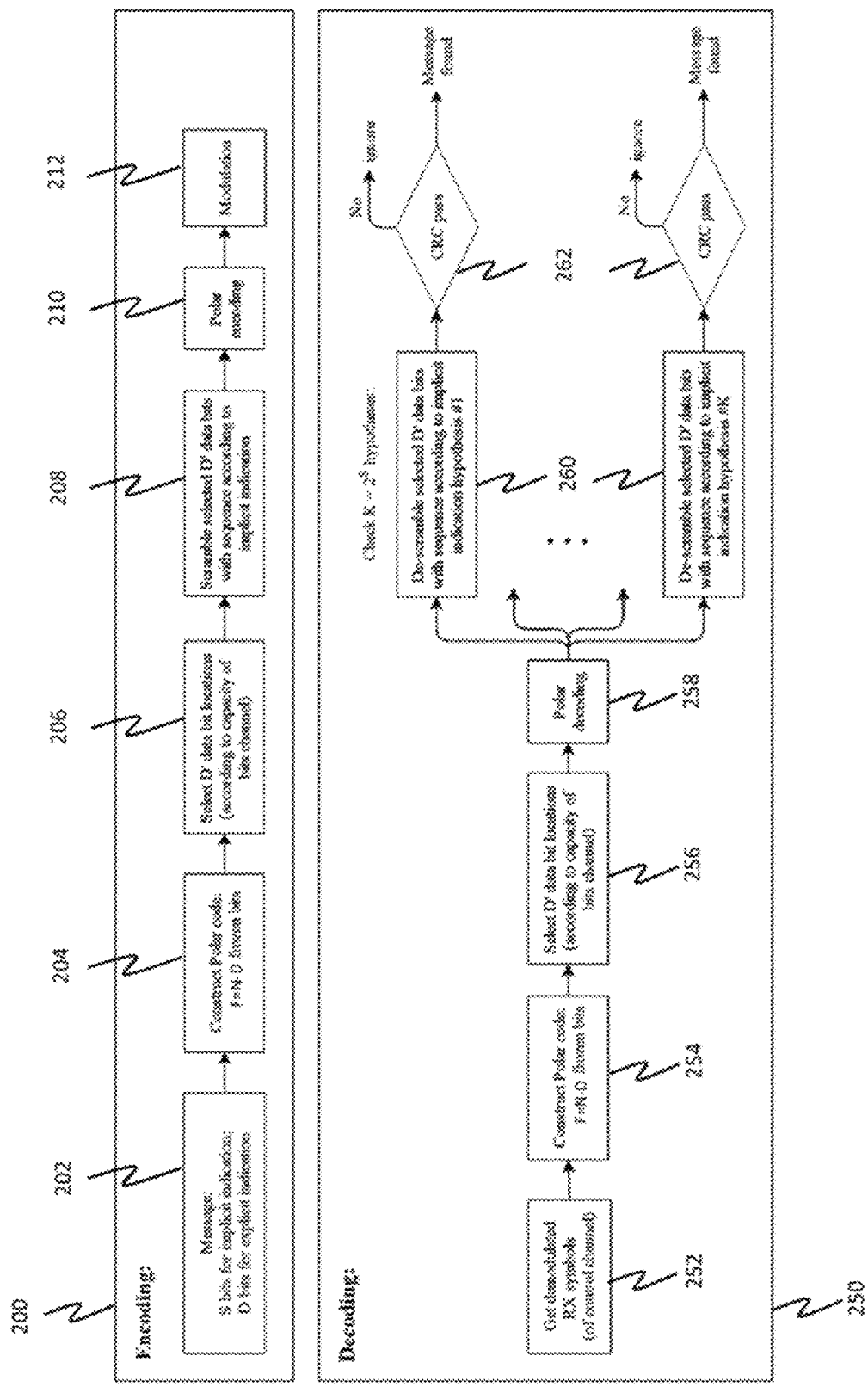
FIG. 2 schematically illustrates a method for encoding data and a method for decoding data according to an embodiment of the present invention.

A first embodiment of the present invention will now be described with reference to FIG. 2 which schematically illustrates a method 200 for encoding data and a method 250 for decoding data according to an embodiment of the present invention.

At a step 202, the method 200 for encoding data receives a block of data or message to be transmitted. The message includes D bits which are to be explicitly indicated. In other words, these D bits of the message or data block map onto the virtual channels provided by the Polar code. The message also includes S bits which are to be implicitly indicated. That is to say, these S bits of the message or data block form additional data which will be transmitted by the method 200.

At a step 204, the method 200 constructs the polar code such that it has D data bits to accommodate the D bits of the message which are to be transmitted. The polar code therefore also has a number F of frozen bits given by F=N-D where N is the code block length. It will be appreciated that the Polar code need not necessarily be constructed each time data is transmitted and that a previously constructed Polar code may be used in some embodiments.

At a step 206, the method 200 selects D' data bit locations or virtual channels according to the capacities or reliabilities of each of the virtual channels.

At a step 208, the method 200 scrambles the selected D' data bits with a scrambling sequence which is determined based on the additional data which is to be implicitly indicated in the transmission.

At a step 210, the method 200 encodes the scrambled data produced at step 206 using the polar encoding.

Finally, at step 212, the method 200 transmits the encoded scrambled data by modulating it onto a carrier.

Turning next to the method 250 for decoding data, at a step 252 the method 250 receives the demodulated encoded scrambled data (i.e. the RX symbols of the control channel). The demodulated encoded scrambled data may also be considered to be a scrambled version of the block of data being transmitted.

At a step 254, the method 250 constructs the Polar code in the same manner as it was constructed at step 204 for the method of transmitting the data. This is because Polar code constructed by the receiver will need to match the construction of the Polar code used by the transmitter in order for the data to be decoded correctly. Again, it will be appreciated that the Polar code need not necessarily be reconstructed each time the method receives data and, in some embodiments, a previously constructed Polar code may be retrieved and used instead.

At a step 256, the method 250 selects or identifies the D' virtual channels (or data bit locations) which have been used to provide an implicit indication of the additional data. Again, these are identified according to the reliabilities or capacities of the virtual channels using the same criteria as was used at step 206 of the method 200 for transmitting the data so as to correctly identify the channels being used to implicitly transmit the additional data.

At a step 258, the method 250 decodes the received demodulated encoded scrambled data using the constructed Polar code.

At a step 260, the method 250 constructs and checks K hypotheses as to the scrambling sequence that was used to scramble the bits transmitted on the D' virtual channels. In this embodiment, the number K of hypotheses is equal to $2^s$. This is because a unique scrambling code may be used for implicitly indicating the S bits of additional data.

The method 250 tests the K hypotheses at steps 260 and 262 by using the hypothesised scrambling code to descramble the decoded scrambled data and then, using a CRC code which is also received for the block of data to check whether the descrambled data is correct. In other words, the method 250 checks whether the CRC indicates that any errors are present in the descrambled data for each of the K hypotheses and determines that the correct hypothesis is the one for which the CRC passes. It will be appreciated that in other embodiments, other error detection mechanisms may be used instead of a CRC. Having identified the correct hypothesis, the method 250 is then able to utilise the D bits of data which were explicitly transmitted using the Polar code as well as the S bits of additional data which are implicitly indicated by the scrambling code associated with the correct hypothesis.

Figure 3:
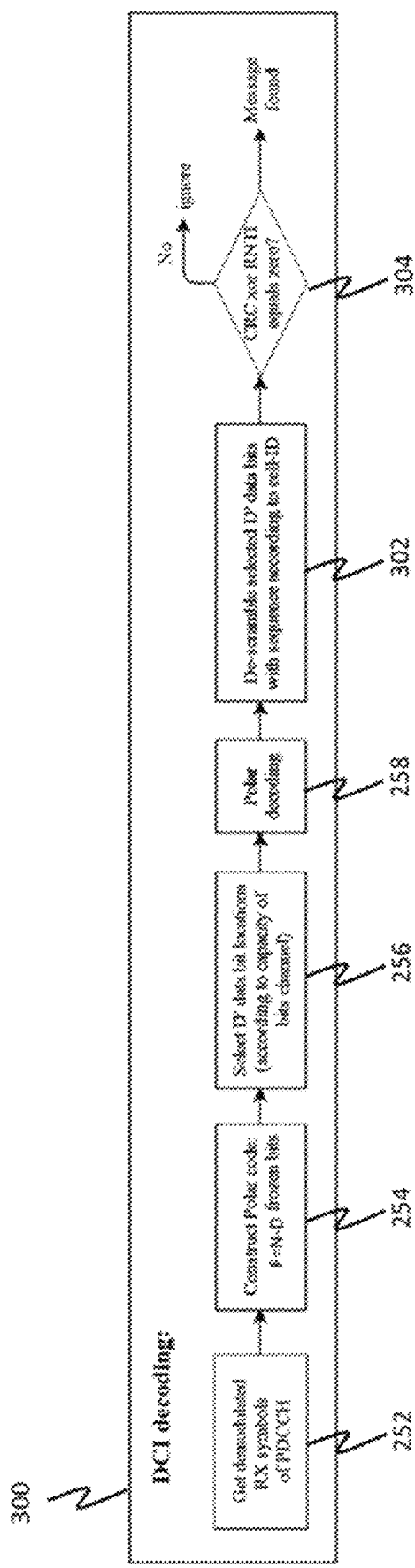
FIG. 3 schematically illustrates a method for DCI decoding in a specific cell ID.

A second embodiment of the invention will now be described with reference to FIG. 3 which schematically illustrates a method 300 for DCI decoding in a specific cell ID.

In LTE, the attached CRC of DCI payload is masked with the RNTI to indicate the UE that the DCI is addressed to it, and the whole signal is scrambled with cell-ID based pseudo random sequence to reduce the inter cell interference (DCI transmitted from one eNB detected as from another eNB for same RNTI, and possibly different UEs).

In this second embodiment, rather than using a number of distinct different scrambling codes which are each associated with a different value of additional data, the additional data itself is used to form the scrambling code which is applied to the data bits on the D' virtual channels. The first four steps 252, 254, 256 and 258 of the method 300 are the same as for the method of receiving data according to the previous embodiment. However, in steps 302 and 304, only a single hypothesis is formed and tested by the method 300. In particular, the method 300 forms a hypothesis according to a predicted value for the additional data which is being implicitly indicated. In this embodiment, the predicted value for the additional data is the cell ID of the DCI, which is a value which is already known to the receiver. The method therefore descrambles the data bits on the D' virtual channels using a scrambling sequence which is based on the cell-ID and determines whether the hypothesis was correct by carrying out an XOR operation on the CRC for the block of data and an RNTI. With this embodiment, no multiple hypotheses are needed and the DCI false-positive rate deriving from inter cell interference is reduced compared to LTE.

Figure 4:
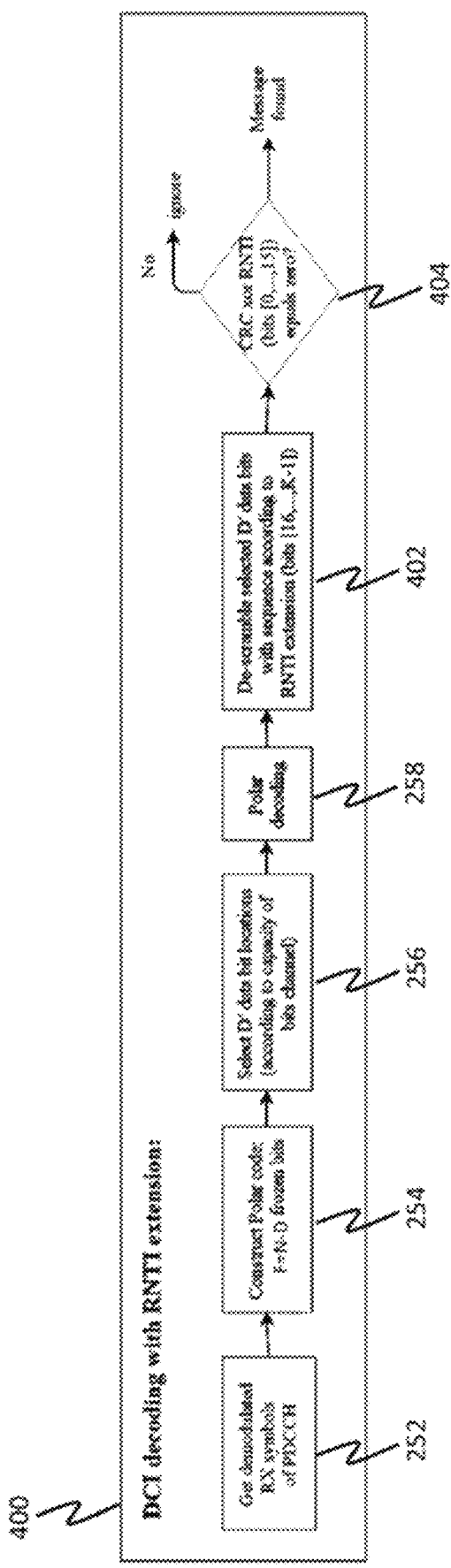
FIG. 4 schematically illustrates a method for DCI decoding with RNTI extension.

A third embodiment of the invention will now be described with reference to FIG. 4 which schematically illustrates a method 400 for DCI decoding with RNTI extension. As for the second embodiment, the additional data itself is used to form the scrambling code which is applied to the data bits on the D' virtual channels. However, in this embodiment the additional data which is used to generate the scrambling code is the RNTI extension. As for the previous embodiments, the first four steps 252, 254, 256 and 258 of the method 400 are the same. However, the scrambling code which is used to form the hypothesis at step 402 of the method is based on the RNTI extension that the receiver is expecting. The method 400 can then check whether this hypothesis is correct by carrying out an XOR operation on the CRC for the block of data and the RNTI. Only a portion of the RNTI bits undergo the masking operation with the CRC output. The remaining RNTI bits are implicitly indicated by the scrambling sequence. The CRC should pass only if the scrambling sequence is properly set.

It will be appreciated that whilst the additional data that is implicitly transmitted in the second and third embodiments does not provide any new data to the receiver (since the cell ID and RNTI extension will already be known to the receiver), they allow the receiver to carry out additional validation on the data being received, improving the robustness of the system by reducing the false-positive-rate deriving from intercell interference compared to LTE in the second embodiment and from other RNTIs in the third embodiment.

Figure 5:
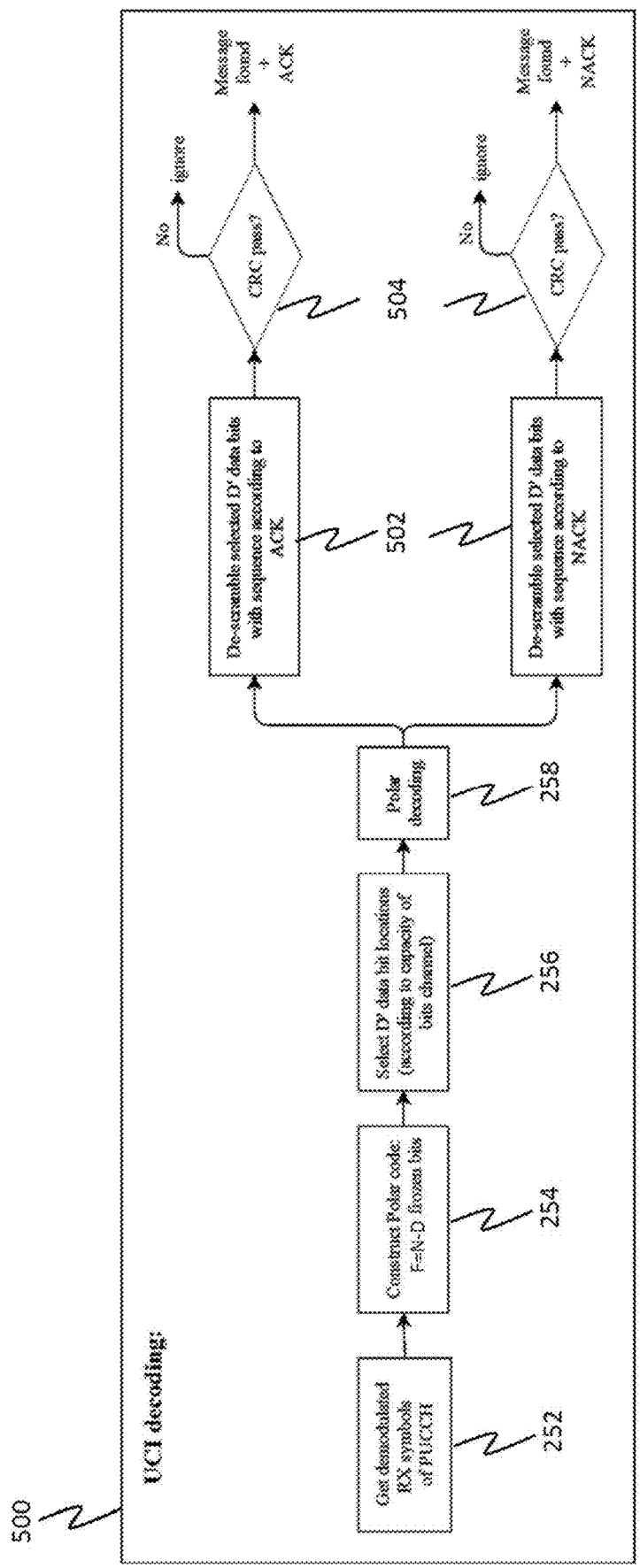
FIG. 5 schematically illustrates a method for UCI decoding with ACK/NACK.

A fourth embodiment of the invention will now be described with reference to FIG. 5, which schematically illustrates a method 500 for UCI decoding with ACK/NACK. The first four steps 252, 254, 256 and 258 of this method 500 are the same as for the previous embodiments. The remaining steps 502 and 504 of the method 500 embodiment is similar to the first embodiment in that more than one scrambling sequence hypothesis is formed. In this embodiment, the additional data which is implicitly transmitted using the D' data bits is an ACK/NACK for UCI. A different scrambling sequence is used to implicitly transmit an ACK than is used to implicitly transmit a NACK. The method 500 forms a hypothesis for the scrambling sequence associated with an ACK and another hypothesis associated with a NACK and uses the CRC to test which of the two hypotheses is correct to determine whether an ACK or a NACK has been received. In this embodiment, this implicit signalling of the ACK/NACK may be the only way in which the ACK/NACK is transmitted.

Alternatively, this implicit signalling could be used together with the (conventional) transmission of ACK/NACK to improve its reliability/latency (which could be very useful for URLLC). In other words, ACK/NACK feedback may sent explicitly, but at the same time, the D' selected locations of data bits with highest reliability may be scrambled using a scrambling code which also implicitly conveys the ACK/NACK feedback.

In a fifth embodiment of the invention, puncturing information for URLLC/eMBB multiplexing is implicitly signalled in PDCCH together with the agreed explicit puncturing indication for URLLC/eMBB multiplexing. Repeat puncturing signalling can improve knowledge of punctured data at eMBB UE and/or provide finer info on the punctured resource. This can provide or more of: a reduced need for ReTx; reduced explicit signalling; and improved eMBB throughput. Optionally, an explicit signal in the DCI at the end of slot where puncturing happens can be used to inform the receiver that information about puncturing will be resent implicitly. Then, at the next slot, on another DCI, the puncturing information is implicitly resent.

Figure 6:
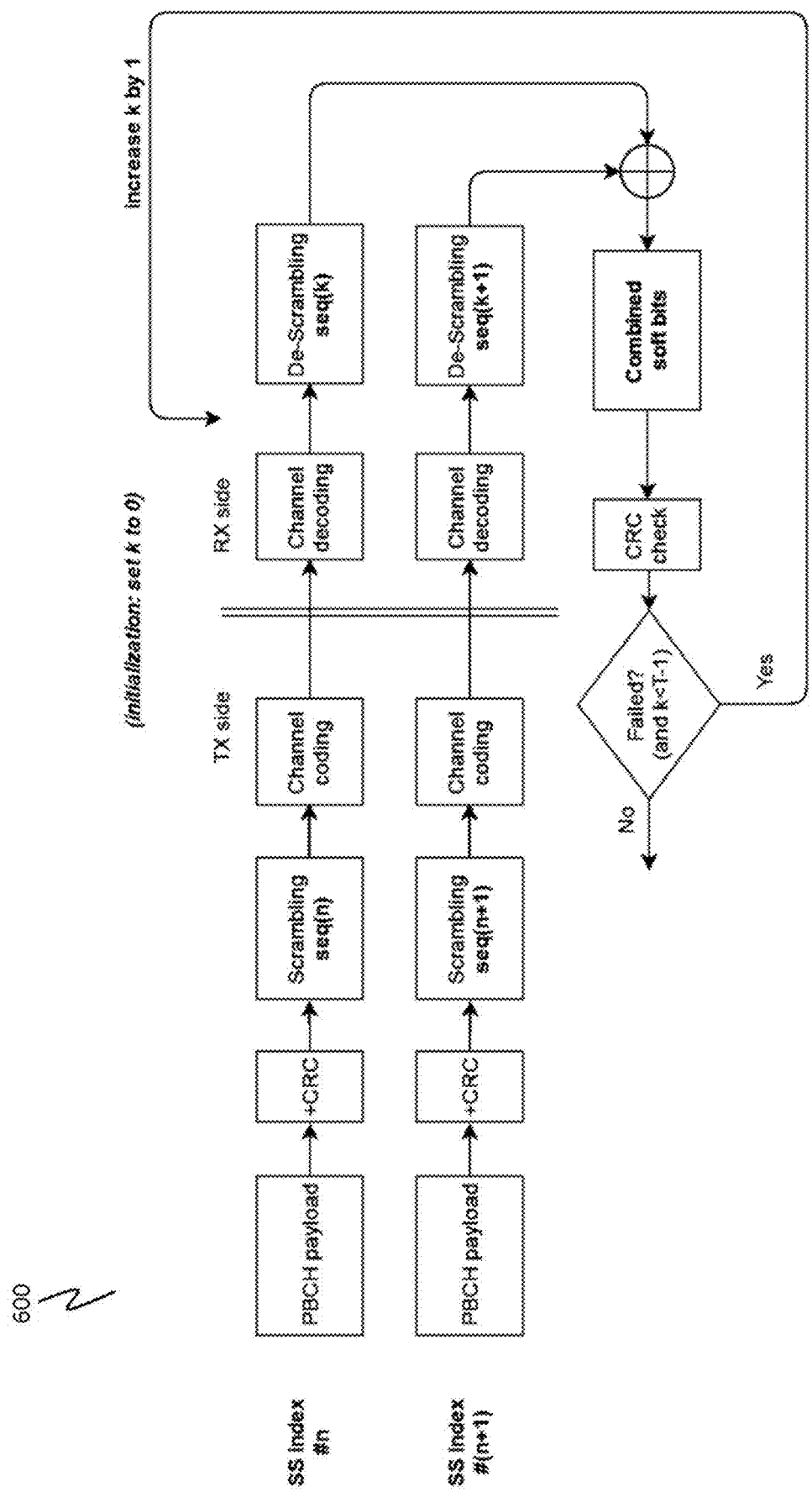
FIG. 6 schematically illustrates a method for soft combining of PBCH with implicit indication of SS time index.

A sixth embodiment of the invention will now be described with reference to FIG. 6 which schematically illustrates a method 600 for soft combining of PBCH with implicit indication of SS time index. According to this embodiment, the SS time index is implicitly transmitted according to the invention along with the PBCH payload that is explicitly transmitted. The PBCH signal received by a UE is dependent on the SS block in which it was transmitted, and so the PBCH can be utilized to infer timing information at the UE. The payload is the same for all SS blocks and can be soft combined with other received PBCHs if the scrambling sequence is initialised properly, as illustrated in the figure below. The figure depicts the soft combining of two PBCHs but any number of PBCHs can be softly combined. The PBCH would be decoded by means of hypothesis testing on SS time index. This embodiment preserves soft combining of received PBCHs from consecutive SS blocks of the same beam for performance boost, similar to that done in LTE.

In some versions of the above-described embodiments, the scrambling sequences may comprise a repetitive element or pattern. For example, scrambling sequences used to implicitly convey 3 bits of additional data could be: 000000000 . . . , 001001001 . . . , 010010010 . . . , 011011011 . . . , 100100100 . . . , 101101101 . . . , 110110110 . . . and 111111111 . . . (i.e. using the repetitive elements "000", "001", "010", "011", "100", "101", "110" and "111" respectively to form the scrambling sequences). Using Reed Solomon code to generate the scrambling sequences can further achieve a maximal Hamming distance between the scrambling sequences and can also make the scrambling sequences more robust.

Figure 7:
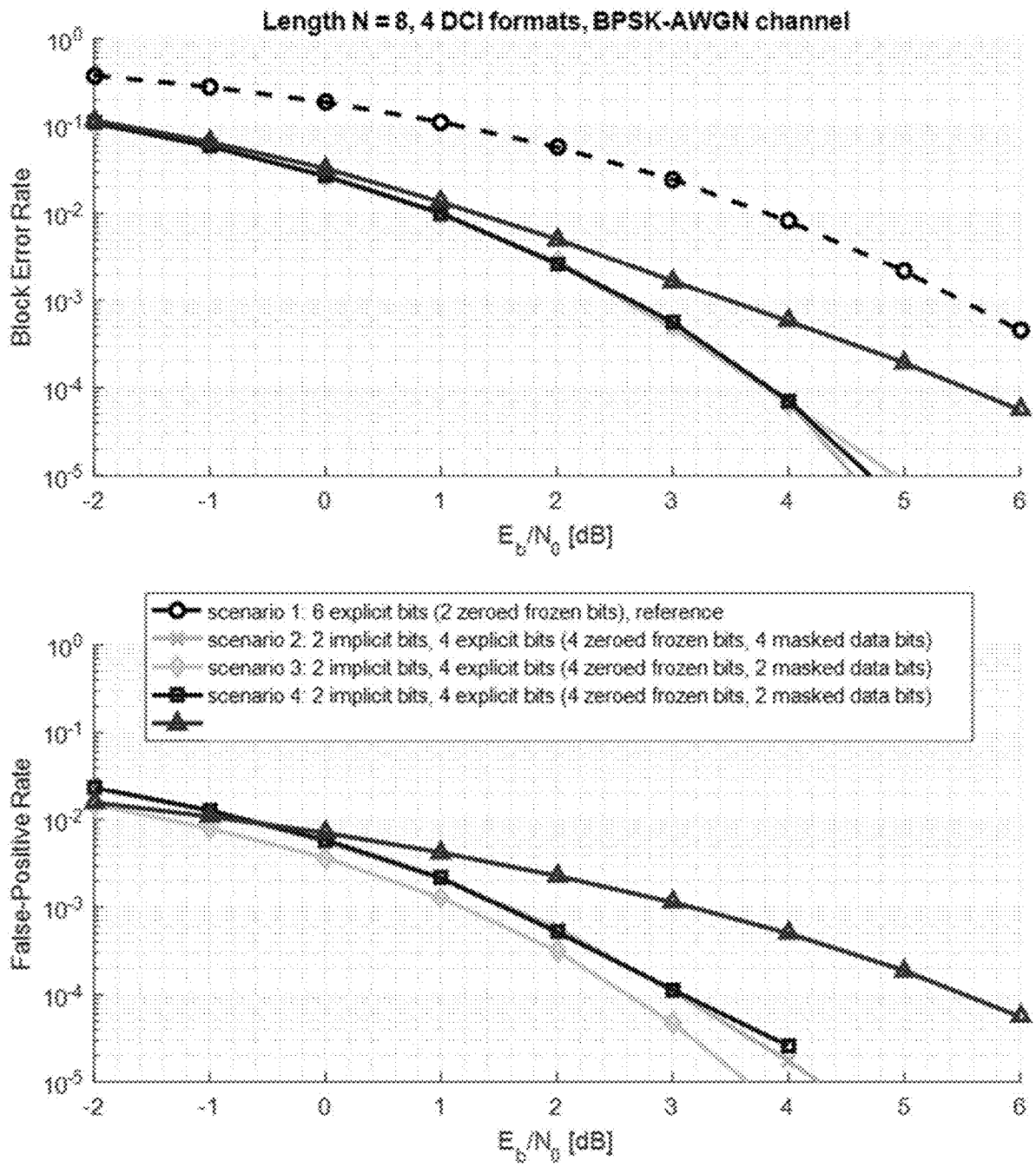
FIG. 7 shows two graphs for the BLER and False-Positive Rate for four different scenarios for a polar block size of 8 with 6 bits of data.
Figure 10:
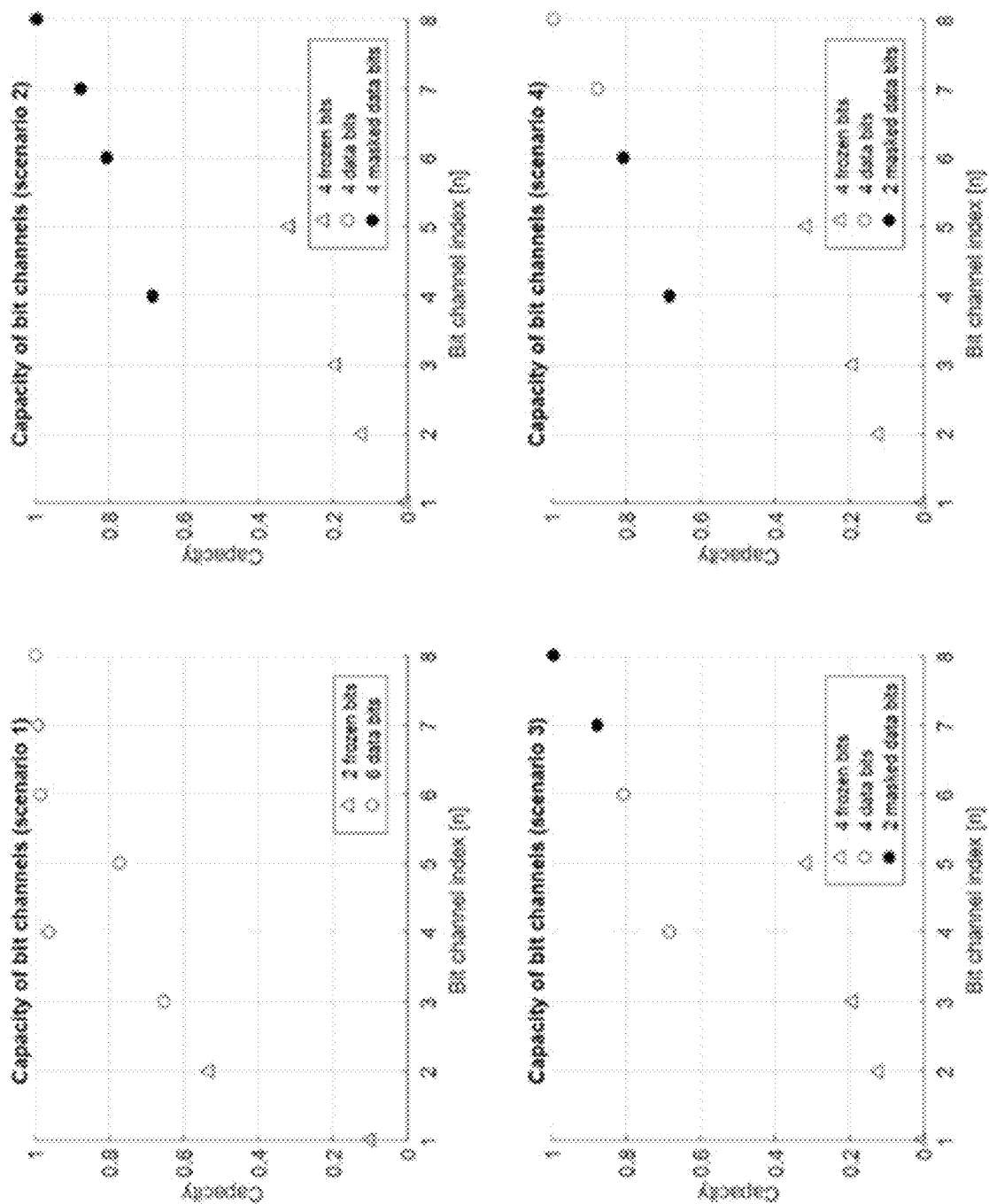
FIGS. 10-12 show simulation results.

In some embodiments of the invention, all of the virtual channels which are allocated for the transmission of data may be selected as being channels for transmitting the additional data. However, in other embodiments, it may be preferable to select a fewer number D' of channels for transmitting the additional data than the total number D of channels allocated for the transmission of data (i.e. D'<D), especially where the channels selected for transmitting the additional data comprise a more reliable subset of the total number of channels allocated for the transmission of data (i.e. where the average reliability of the channels selected for transmitting the additional data is higher than the average reliability of all of the channels allocated for the transmission of data). The reason for this is illustrated in FIG. 7 which shows two graphs for the BLER and False-Positive Rate for four different scenarios for a polar block size of 8 with 6 information bits being sent. FIG. 10 shows simulation results.

The first scenario, represented by the open circle plots on these graphs relates to a normal polar encoding using 6 data bits and 2 frozen bits, without any additional data being implicitly transmitted. The first scenario therefore explicitly transmits all 6 bits of data.

The second scenario, represented by the cross plots on these graphs relates to the use of the present invention to transmit the data using a polar encoding with 4 data bits and 4 frozen bits, wherein all 4 data bits are scrambled with a scrambling sequence to implicitly transmit 2 additional bits of data. Therefore, the second scenario explicitly transmits 4 bits of data and implicitly transmits 2 bits of data.

The third scenario, represented by the open diamond plots on the graphs relates to the use of the present invention to transmit the data using a polar encoding with 4 data bits and 4 frozen bits, wherein only the two data bits with the highest capacity (or reliability) are scrambled with a scrambling sequence to implicitly transmit 2 additional bits of data. Therefore, the third scenario explicitly transmits 4 bits of data and implicitly transmits 2 bits of data.

The fourth scenario, represented by the open square plots on the graphs relates to the use of the present invention to transmit the data using a polar encoding with 4 data bits and 4 frozen bits, wherein the two data bits with the lowest capacity (or reliability) are scrambled with a scrambling sequence to implicitly transmit 2 additional bits of data. Therefore, the fourth scenario explicitly transmits 4 bits of data and implicitly transmits 2 bits of data.

The remaining plot shown on these graphs is not relevant to the present invention.

These graphs show results of tests conducted in each of the four scenarios. In these tests, the CRC is not included and the content of the messages is instead checked by comparing the received bits to the transmitted bits. As can be seen, the third scenario has a lower false-positive rate compared to the second and fourth scenarios. Whilst the false-positive rate for the third scenario is higher than for the first scenario, the BLER for the third scenario is lower than that of the first scenario.

Figure 8:
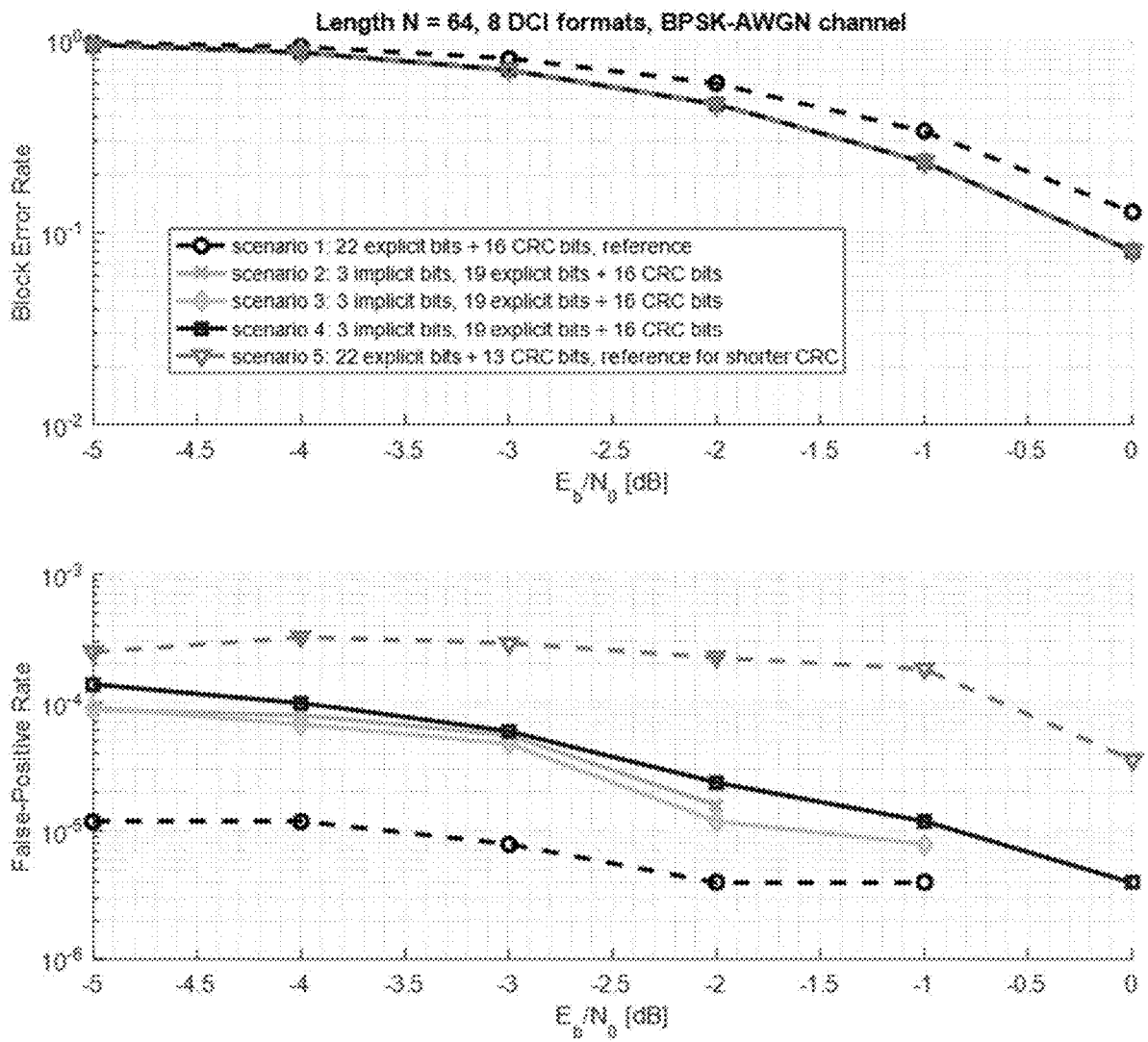
FIG. 8 shows graphs of the BLER and False-Positive Rate for further scenarios which are simulated using a Polar block size of 64 with 38 bits of data (22 bits of message data and 16 bits of CRC data)
Figure 11:
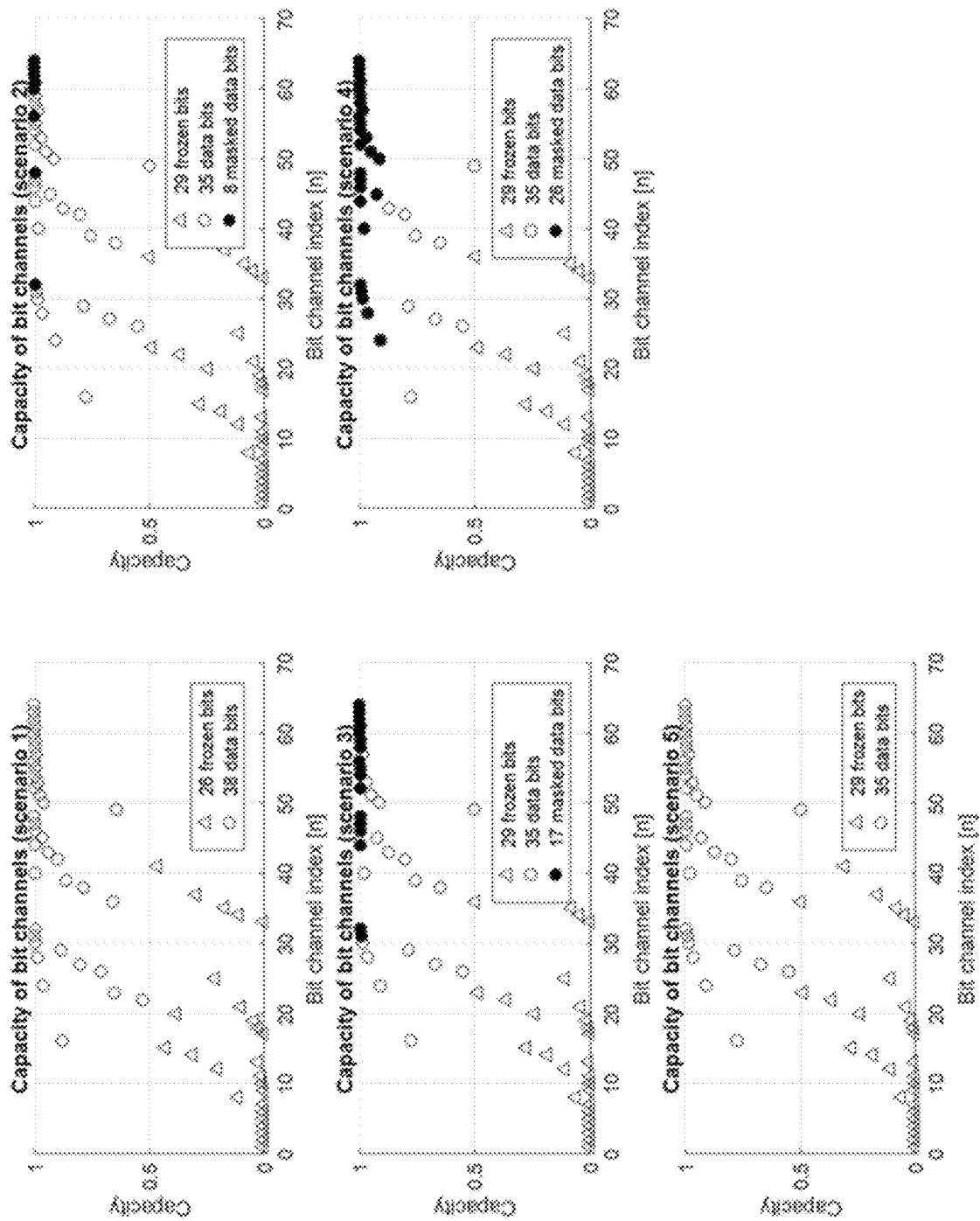

Turning next to FIG. 8 which shows graphs of the BLER and False-Positive Rate for further scenarios which are simulated using a Polar block size of 64 with 38 data bits (22 bits of message data and 16 bits of CRC data). FIG. 11 shows simulation results. The first four scenarios illustrated on FIG. 8 correspond to the four scenarios discussed above in relation to FIG. 7. That is to say, the first scenario serves as a benchmark with all the message data bits being transmitted explicitly. The second scenario transmits 19 bits of message data explicitly and transmits the remaining 3 bits of message data implicitly by scrambling the data that is transmitted using 8 scrambling locations with the highest capacity. The third scenario also only transmits 19 bits of message data explicitly and transmits the remaining 3 bits of message data implicitly using 17 scrambling locations with highest capacity. The fourth scenario also only transmits 19 bits of message data explicitly and transmits the remaining 3 bits of message data using 26 scrambling locations with the highest. Since the second, third and fourth scenarios reduce the coding rate of the polar code below that of the regular Polar coding used in the first scenario, a fifth scenario is also included in the graphs which includes 3 less CRC bits to provide a benchmark at the lower coding rate.

We expect a false positive rate of about $\frac{1}{2}^{16}=1.5*10^{-5}$ deriving from the CRC, roughly multiplied by the number of tested hypotheses. From the graphs, it can be seen that the third scenario has a lower false-positive rate when compared to the regular coding with a shorter CRC (as used in the fifth scenario). This is because it takes advantage of the polar nature of the polar encoding to select locations for scrambling to implicitly convey the additional data based on the capacity or reliability of the virtual channels.

One important observation is that it is preferable to select as many virtual channels for transmitting the additional data as possible provided that their capacity is kept close to 1 (as for the third scenario). By selecting more virtual channels for transmitting the additional data, the scrambling sequences used to implicitly convey the additional data are longer, meaning that the scrambling sequences can be more spaced apart (i.e. have a greater Hamming distance between them) reducing the likelihood of one sequence become another through the introduction of random errors.

Therefore, the selection of the number of channels according to this criterion can decrease the false-positive rate.

In order to optimize the number of channels that should be selected to implicitly convey the additional information to decrease the false-positive rate, the following equations may be used to evaluate the competing effects of improving BLER against the degradation in the False Positive Rate (FPR). In these equations, the following notations are used:
N: Code block length;
D: Number of channels allocated for the transmission of data;
K: Number of different values of the additional data;
S: Number of channels which are selected for transmitting the additional data (i.e., the scrambling sequence length);
C: CRC (or any error correction code) length;
R: Code rate;
$R_{ref}$: Code rate without implicit indication for reference;
Sum{element}range: Summation of the elements within range;
Mean{element}range: Average or mean value of the elements within range; and
Prod{element}range: Product of the elements within range.

Figure 9:
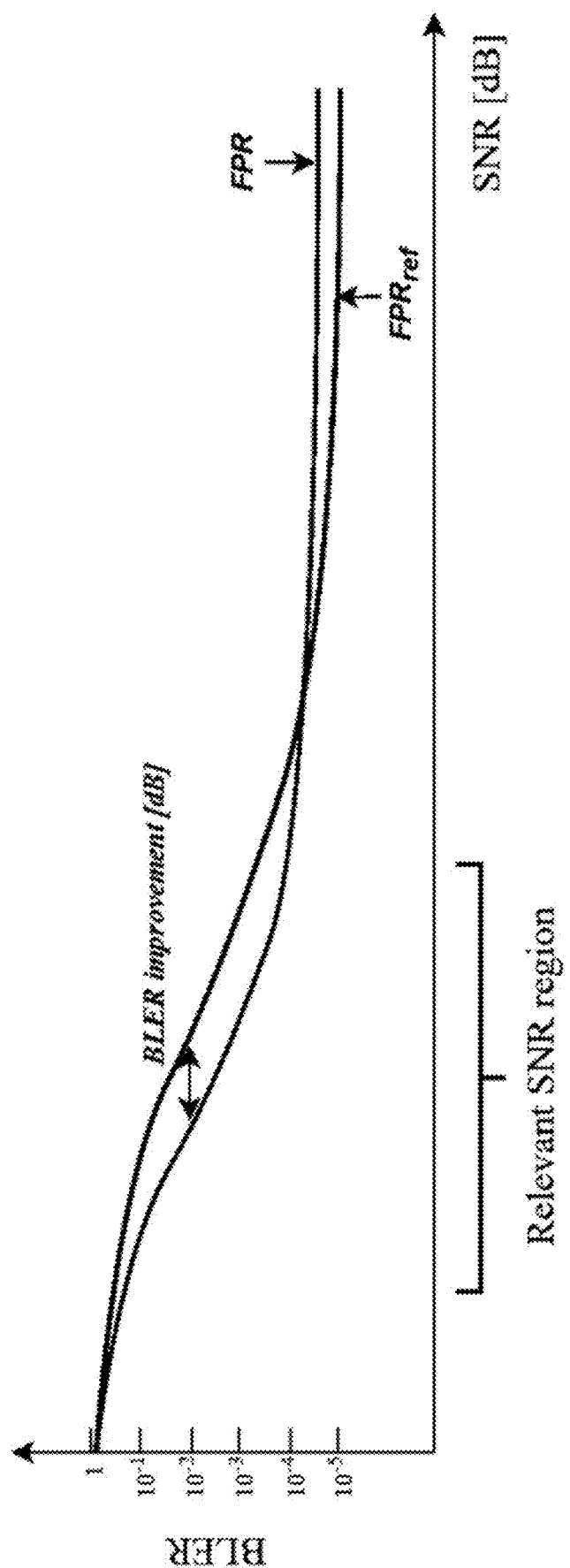
FIG. 9 shows a graph of the BLER improvement provided by embodiments of the present invention.

The BLER improvement is modelled in the relevant SNR region (around BLER of ~10-2). The FPR acts as a BLER floor for very high SNR where the BLER value is substantially reduced, as illustrated in FIG. 9 which shows a graph of the BLER improvement provided by embodiments of the present invention. The BLER improvement is given by the SNR gain in [dB] as a function of the number of implicit bits (i.e. the number of virtual channels allocated to the transmission of data which are selected for the implicit transmission of the additional data).

First, the Polar code is constructed without implicit indication: The number of data bits equals $D+[\log_2 K]$, and the code rate equals $Rref=(D+[\log_2 K])/N$. The capacity of bits channel, $Capacity_{ref}$, is then calculated and the capacity ratio gives the relative capacity of the data bits:

$$CapacityRatio_{ref}=Sum\{Capacity_{ref}\}_{data\_positions}/Sum\{Capacity_{ref}\}_{all\_positions}.$$

Second, the Polar code is constructed with implicit indication: The number of data bits is reduced to D, and the code rate is effectively reduced to $R=D/N$. The capacity of bits channel, Capacity, is then calculated and the capacity ratio gives the relative capacity of the data bits:

$$CapacityRatio=Sum\{Capacity\}_{data\_positions}/Sum\{Capacity\}_{all\_positions}.$$

Finally, the BLER improvement is given by the SNR shift in [dB] according to $$BLER\_improvement=10*\log_{10}((1-CapacityRatio)/(1-CapacityRatio_{ref}))*R_{ref}[dB].$$

Equivalently this also equals to $$BLER\_improvement=10*\log_{10}(CompCapacityRatio/CompCapacityRatio_{ref})*R_{ref}[dB],$$

where
$CompCapacityRatio_{ref}=Sum\{Capacity_{ref}\}_{frozen\_positions}$
$Sum\{Capacityref\}_{all\_positions}$
and $CompCapacityRatio=Sum\{Capacity\}_{frozen\_positions}$
$Sum\{Capacity\}_{all\_positions}$ The predicted FPR is given by $FPR=(1+(K-1)*P)*FPR_{ref}$, where K is the number of tested hypotheses for the implicit information, $FPR_{ref}=2^{-c}$ gives the false alarm probability for C-bits CRC length and P expresses the average probability of another hypothesis's sequence to become the transmitted sequence.

To calculate P we product (multiply) the bits' probabilities, which is actually according to the Capacity of bits channel:

$$P=2*(((1-AvgCapacity)AvgHammingDist)*((AvgCapacity)(S-AvgHammingDist))*Prod\{Capacity\}data\_unmasked\_positions)1/D$$

where $AvgCapacity=Mean\{Capacity\}_{data\_masked\_positions}$ the data masked positions are the set of S selected bits locations for scrambling, and the data un-masked positions are the complementary set in size of D−S. The average hamming distance is given by AvgHammingDist y S/sqrt [$\log_2 K$]).

Factor 2 is added to P since typically the value $p1* \ldots *pn)^{1/n}$ where all $p_i$ are between 0 to 1 is a number between 0 to 1. For uniform probabilities the average of this formula is about ½, thus with factor 2 we get P=1, and this gives the upper bound for the $FPR=K*FPR_{ref}$. With the proposed method this value is very close to zero in the relevant SNR region since (1−AvgCapacity) goes to zero and we get $FPR=(1+p)*FPR_{ref}$ where $p<<(K-1)$.

This predicted FPR allows us to select the best S by minimizing FPR for a given number of hypotheses K, number of explicit bits D and code block length N: Optimal $S=Argmin_{overS}\{FPR\}$.

The signal processing functionality of the embodiments of the invention, especially the gNB and the UE may be achieved using computing systems or architectures known to those who are skilled in the relevant art. Computing systems such as, a desktop, laptop or notebook computer, hand-held computing device (PDA, cell phone, palmtop, etc.), mainframe, server, client, or any other type of special or general purpose computing device as may be desirable or appropriate for a given application or environment can be used. The computing system can include one or more processors which can be implemented using a general or special-purpose processing engine such as, for example, a microprocessor, microcontroller or other control module.

The computing system can also include a main memory, such as a random access memory (RAM) or other dynamic memory, for storing information and instructions to be executed by a processor.

Such a main memory also may be used for storing temporary variables or other intermediate information during execution of instructions to be executed by the processor. The computing system may likewise include a read only memory (ROM) or other static storage device for storing static information and instructions for a processor.

The computing system may also include an information storage system which may include, for example, a media drive and a removable storage interface. The media drive may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media may include, for example, a hard disk, floppy disk, magnetic tape, optical disk, CD or DVD, or other fixed or removable medium that is read by and written to by media drive. The storage media may include a computer-readable storage medium having particular computer software or data stored therein.

In alternative embodiments, an information storage system may include other similar components for allowing computer programs or other instructions or data to be loaded into the computing system. Such components may include, for example, a removable storage unit and an interface, such as a program cartridge and cartridge interface, a removable memory (for example, a flash memory or other removable memory module) and memory slot, and other removable storage units and interfaces that allow software and data to be transferred from the removable storage unit to computing system.

The computing system can also include a communications interface. Such a communications interface can be used to allow software and data to be transferred between a computing system and external devices. Examples of communications interfaces can include a modem, a network interface (such as an Ethernet or other NIC card), a communications port (such as, for example, a universal serial bus (USB) port), a PCMCIA slot and card, etc. Software and data transferred via a communications interface are in the form of signals which can be electronic, electromagnetic, and optical or other signals capable of being received by a communications interface medium.

In this document, the terms 'computer program product', 'computer-readable medium' and the like may be used generally to refer to tangible media such as, for example, a memory, storage device, or storage unit. These and other forms of computer-readable media may store one or more instructions for use by the processor comprising the computer system to cause the processor to perform specified operations. Such instructions, generally referred to as 'computer program code' (which may be grouped in the form of computer programs or other groupings), when executed enable the computing system to perform functions of embodiments of the present invention. Note that the code may directly cause a processor to perform specified operations, be compiled to do so, and/or be combined with other software, hardware, and/or firmware elements (e.g. libraries for performing standard functions) to do so.

In an embodiment where the elements are implemented using software, the software may be stored in a computer-readable medium and loaded into computing system using, for example, removable storage drive. A control module (in this example, software instructions or executable computer program code), when execute by the processor in the computer system, causes a processor to perform the functions of the invention as described herein.

Furthermore, the inventive concept can be applied to any circuit for performing signal processing functionality within a network element. It is further envisaged that, for example, a semiconductor manufacturer may employ the inventive concept in a design of a stand-alone device, such as a microcontroller of a digital signal processor (DSP), or application-specific integrated circuit (ASIC) and/or any other sub-system element.

It will be appreciated that, for clarity purposes, the above description has described embodiments of the invention with reference to a single processing logic. However, the inventive concept may equally be implemented by way of a plurality of different functional units and processors to provide the signal processing functionality. Thus, references to specific functional units are only to be seen as references to suitable means for providing the described functionality, rather than indicative of a strict logical or physical structure or organisation.

Aspects of the invention may be implemented in any suitable form including hardware, software, firmware or any combination of these. The invention may optionally be implemented, at least partly, as computer software running on one or more data processors and/or digital signal processors or configurable module components such as FPGA devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiment, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Although the present invention has been described in connection with some embodiments, it is not intended to be limited to the specific form set forth herein. Rather, the scope of the present invention is limited only by the accompanying claims.

Additionally, although a feature may appear to be described in connection with particular embodiments, one skilled in the art would recognise that various features of the described embodiments may be combined in accordance with the invention. In the claims, the term 'comprising' or 'including' does not exclude the presence of other elements.

Figure 12:
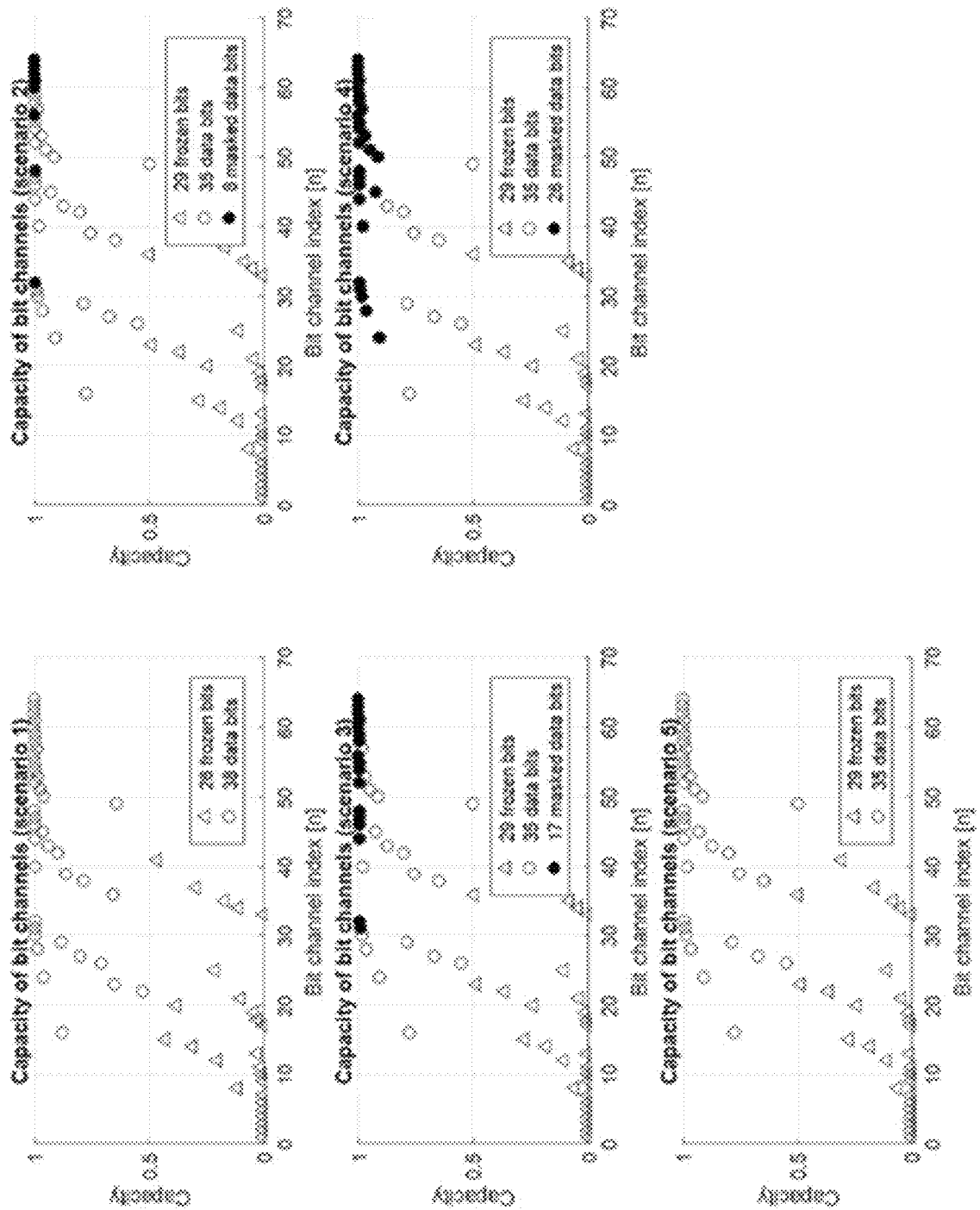

Set out below and in FIG. 12 are examples of simulation results based on the above disclosure:—

Simulated Polar block size of 64 with 38 uncoded bits, divided to 22 bits for the message payload and 16 bits for CRC; 3 bits are implicitly signalled. We expect a false positive rate of about $1/2_{16}=1.5*10^{-5}$ deriving from the CRC, roughly multiplied by the number of tested hypotheses for worse-case.

For comparison, we simulated 38 uncoded bits with shortened CRC (only 13-bits) in order to have same coding rate with regular Polar coding.

Simulated results are given below. The false-positive rate is calculated for the UE message, checking false positive when the CRC pass but the message is incorrect and checking false positive when CRC pass with a different tested hypothesis. We observe the proposed scheme has lower false-positive rate when compared to regular coding with shorter CRC, since it takes advantage of the polarity by selecting the scrambling locations according to the capacity of bits channels.

One important observation is that it is preferable to choose as many data bit location for scrambling as long as their capacity is kept close to 1 (e.g. scenario 3 would be best choice); Long scrambling sequences to convey the implicit info make it harder for one sequence to become another. With such selection the false-positive rate is decreased.

Aspects of the invention are disclosed in the following numbered clauses:

1. A method for transmitting data over a physical channel using a polar code, the polar code defining a plurality of virtual channels within the physical channel and allocating a subset of the virtual channels for the transmission of data, each of the subset of virtual channels for the transmission of data being mapped to respective bits of a block of data to be transmitted, the method comprising:

receiving a block of data to be transmitted;

receiving additional data to be transmitted together with the block of data;

selecting one or more of the virtual channels which are allocated for the transmission of data as being channels for transmitting the additional data;

determining a scrambling sequence based on the additional data;

applying the scrambling sequence to those bits of the block of data which map onto the one or more virtual channels for transmitting the additional data to generate a scrambled version of the block of data; and transmitting the scrambled version of the block of data according to the polar code, wherein error detection data is also transmitted which enables the detection of errors in the block of data.

2. The method of clause 1, wherein the method further comprises receiving the error detection data for the block of data.
3. The method of clause 2, wherein the block of data that is received comprises the error detection data.
4. The method of clause 1, wherein the method further comprises generating the error detection data for the block of data.
5. The method of any one of the preceding clauses, wherein the scrambled version of the block of data comprises the error detection data.
6. The method of any one of clauses 1 to 4, wherein the method further comprises transmitting the error detection data separately from the scrambled version of the block of data.
7. The method of any one of the preceding clauses, wherein the error detection data comprises a cyclic redundancy check code.
8. The method of any one of the preceding clauses, wherein the selection of the one or more virtual channels for transmitting the additional data is based, at least in part, on the respective reliabilities of the one or more virtual channels.
9. The method of clause 8, wherein selecting the one or more virtual channels for transmitting the additional data comprises selecting one or more virtual channels having a highest reliability amongst the one or more virtual channels allocated for the transmission of data.
10. The method of either one of clauses 8 or 9, wherein selecting the one or more virtual channels for transmitting the additional data comprises selecting one or more virtual channels having a reliability which exceeds a predetermined threshold.
11. The method of any one of the preceding clauses, wherein the polar code block size is smaller than the size of the received block of data and the additional data comprises those bits of the received block of data which are not mapped onto virtual channels by the polar code.
12. The method of any one of the preceding clauses, wherein the scrambling sequence is selected from one or more distinct scrambling sequences, each distinct scrambling sequence being associated with a different value for the additional data.
13. The method of clause 12, wherein the one or more distinct scrambling sequences comprise a scrambling sequence which is associated with an ACK in UCI and a scrambling sequence which is associated with a NACK in UCI.
14. The method of clause 12, wherein the one or more distinct scrambling sequences comprise scrambling sequences which are associated with SS block time index indication by PBCH.
15. The method of any one of clauses 12 to 14, wherein the number of channels which are selected for transmitting the additional data is equal to $\log_2 K$ rounded up to the next integer value, wherein K is the number of distinct scrambling sequences from which the scrambling sequence is selected. 16. The method of any one of clauses 12 to 14, wherein the number of channels which are selected for transmitting the additional data is greater than $\log_2 K$ rounded up to the next integer value, wherein K is the number of distinct scrambling sequences from which the scrambling sequence is selected.
17. The method of clause 16, wherein the distinct scrambling sequences are selected so as to maximise Hamming distances between each of the distinct scrambling sequences for a given number of virtual channels which are selected for transmitting the additional data.
18. The method of clause 17, further comprising determining the number of channels which are selected for transmitting the additional data to minimise the false positive error rate.
19. The method of any one of clauses 1 to 11 wherein the scrambling sequence comprises the additional data.
20. The method of clause 19, wherein the additional data comprises data which is already known to a receiver of the transmitted data.
21. The method of clause 20, wherein the additional data comprises a cell ID associated with a cell in a mobile network.
22. The method of clause 20, wherein the additional data comprises an RNTI, or a part of the RNTI.
23. The method of any one of the preceding clauses, wherein the additional data comprises repeated data which has previously been transmitted.
24. The method of clause 23, wherein the repeated data comprises an ACK/NACK indication in UCI.
25. The method of any one of the preceding clauses, wherein the additional data comprises puncturing information in URLLC/eMBB multiplexing.
26. The method of any one of the preceding clauses, wherein the polar code is constructed according to a polar code construction parameter ε which is equal to 1−R, wherein R equals the number D of virtual channels for the transmission of data divided by the remaining number of virtual channels which are not allocated to the transmission of data.
27. A method for receiving data over a physical channel using a polar code, the polar code defining a plurality of virtual channels within the physical channel and allocating a subset of the virtual channels for the transmission of data, each of the subset of virtual channels for the transmission of data being mapped to respective bits of a block of data being transmitted, the method comprising:
    receiving a scrambled version of a block of data, wherein error detection data is also received which enables the detection of errors in the block of data;
    identifying one or more of the virtual channels which are allocated for the transmission of data as being channels on which additional data has been transmitted, wherein the scrambled version of the block of data is formed by scrambling the bits of the block of data which were transmitted on those channels using a scrambling sequence which is based on the additional data;
    generating one or more hypotheses as to the scrambling sequence which has been applied to the channels on which the additional data has been transmitted;
    testing each of the one or more hypotheses to identify a correct hypothesis by descrambling the scrambled version of the block of data according to each hypothesis and using the error detection data to determine whether any errors are present in the descrambled block of data, wherein the correct hypothesis is one for which no errors are present in the descrambled block of data; and
    determining the additional data that has been transmitted based on the correct hypothesis of the scrambling sequence that has been applied to the channels on which the additional data has been transmitted.
28. The method of clause 27, wherein the error detection data is received separately from the scrambled version of the block of data.
29. The method of clause 27, wherein the scrambled version of the block of data comprises the error detection data.
30. The method of any one of clauses 27 to 29, wherein the error detection data comprises a cyclic redundancy check code.

31. The method of any one of clauses 27 to 30, wherein the identification of the one or more virtual channels on which additional data has been transmitted is based, at least in part, on the respective reliabilities of the one or more virtual channels.

32. The method of clause 31, wherein the identification of the one or more virtual channels on which additional data has been transmitted comprises identifying one or more virtual channels having a highest reliability amongst the one or more virtual channels allocated for the transmission of data.

33. The method of clause 32, wherein the identification of the one or more virtual channels on which additional data has been transmitted comprises identifying one or more virtual channels having a reliability which exceeds a predetermined threshold.

34. The method of any one of clauses 27 to 33, wherein generating the one or more hypotheses as to the scrambling sequence which has been applied to the channels on which the additional data has been transmitted comprises generating a hypotheses for each of one or more distinct scrambling sequences, each distinct scrambling sequence being associated with a different value for the additional data.

35. The method of clause 34, wherein the one or more distinct scrambling sequences comprise a scrambling sequence which is associated with an ACK in UCI and a scrambling sequence which is associate with a NACK in UCI.

36. The method of clause 34, wherein the one or more distinct scrambling sequences comprise scrambling sequences which are associated with SS block time index indication by PBCH.

37. The method of any one of clauses 34 to 36, wherein the number of channels which are identified as being channels on which additional data has been transmitted is equal to $\log_2 K$ rounded up to the next integer value, wherein K is the number of distinct scrambling sequences for which hypotheses are generated.

38. The method of any one of clauses 34 to 36, wherein the number of channels which are identified as being channels on which additional data has been transmitted is greater than $\log_2 K$ rounded up to the next integer value, wherein K is the number of distinct scrambling sequences for which hypotheses are generated.

39. The method of clause 38, wherein the distinct scrambling sequences are selected so as to maximise Hamming distances between each of the distinct scrambling sequences for a given number of virtual channels which are identified as being channels on which additional data has been transmitted.

40. The method of clause 39, further comprising determining the number of channels which are identified as being channels on which additional data has been transmitted to minimise the false positive error rate.

41. The method of any one of clauses 27 to 35, wherein generating one or more hypotheses as to the scrambling sequence which has been applied to the channels on which the additional data has been transmitted comprises generating a prediction of the additional data which has been transmitted and generating a scrambling sequence which comprises the predicted additional data.

42. The method of clause 41, wherein the prediction of the additional data is generated based on data which already known to the receiver.

43. The method of clause 42, wherein the prediction of the additional data comprises a cell ID associated with a cell in a mobile network.

44. The method of clause 42, wherein the additional data comprises an RNTI, or a part of the RNTI.

45. The method of any one of clauses 27 to 44, wherein the additional data comprises repeated data which has previously been transmitted and the method further comprises determining whether the repeated data matches the data which has previously been received.

46. The method of clause 45, wherein the repeated data comprises an ACK/NACK indication in UCI.

47. The method of any one of clauses 27 to 46, wherein the additional data comprises puncturing information in URLCC/eMBB multiplexing.

48. The method of any one of clauses 27 to 47, wherein the polar code is constructed according to a polar code construction parameter ε which is equal to 1−R, wherein R equals the number D of virtual channels for the transmission of data divided by the remaining number of virtual channels which are not allocated to the transmission of data.

49. An apparatus which is configured to either transmit data over a physical channel according to the method of any one of clauses 1 to 26, receive data over a physical channel according to the method of any one of clauses 27 to 48, or both.

50. The apparatus of clause 49, wherein the apparatus is a base station in a mobile network.

51. The apparatus of clause 49, wherein the apparatus is a mobile device in a mobile network.

52. A mobile network comprising one or more base stations according to clause 50 and one or more mobile devices according to clause 51.

53. A non-transitory computer readable medium having computer readable instructions stored thereon for execution by a processor to perform the method according to any one of clauses 1 to 48.

The invention claimed is:

1. A method for transmitting data over a physical channel using a polar code, the polar code defining a plurality of virtual channels within the physical channel and allocating a subset of the virtual channels for transmission of data, each of the subset of the virtual channels for the transmission of data being mapped to respective bits of a block of data to be transmitted, the method comprising:
   receiving a block of data to be transmitted;
   receiving additional data to be transmitted together with the block of data;
   selecting one or more, but not all, of the virtual channels which are allocated for the transmission of data as being channels for transmitting the additional data;
   determining a scrambling sequence based on the additional data;
   applying the scrambling sequence to those bits of the block of data which map onto the one or more of the virtual channels selected for transmitting the additional data to generate a scrambled version of the block of data; and
   transmitting the scrambled version of the block of data according to the polar code, wherein error detection data is also transmitted which enables a detection of errors in the block of data.

2. The method of claim 1, wherein the method further comprises receiving the error detection data for the block of data.

3. The method of claim 2, wherein the block of data that is received comprises the error detection data.

4. The method of claim 1, wherein the method further comprises generating the error detection data for the block of data.

5. The method of claim 1, wherein the error detection data comprises a cyclic redundancy check code.

6. The method of claim 1, wherein the selection of the one or more of the virtual channels for transmitting the additional data is based, at least in part, on respective reliabilities of the one or more of the virtual channels.

7. The method of claim 6, wherein selecting the one or more of the virtual channels for transmitting the additional data comprises selecting one or more virtual channels having a highest reliability amongst the one or more virtual channels allocated for the transmission of data.

8. The method of claim 1, wherein the scrambling sequence is selected from one or more distinct scrambling sequences, each distinct scrambling sequence being associated with a different value for the additional data.

9. The method of claim 8, wherein the scrambling is associated with SS block time index indication by PBCH.

10. The method of claim 1, wherein the scrambling sequence comprises the additional data.

11. The method of claim 10, wherein the additional data comprises data which is already known to a receiver of the transmitted data, and optionally the additional data comprises a cell ID associated with a cell in a mobile network.

12. A method for receiving data over a physical channel using a polar code, the polar code defining a plurality of virtual channels within the physical channel and allocating a subset of the virtual channels for a transmission of data, each of the subset of the virtual channels for the transmission of data being mapped to respective bits of a block of data being transmitted, the method comprising:
receiving a scrambled version of a block of data, wherein error detection data is also received which enables a detection of errors in the block of data;
identifying one or more, but not all, of the virtual channels which are allocated for the transmission of data as being channels on which additional data has been transmitted, wherein the scrambled version of the block of data is formed by scrambling the bits of the block of data which were transmitted on the virtual channels using a scrambling sequence which is based on the additional data;
generating one or more hypotheses as to the scrambling sequence which has been applied to the channels on which the additional data has been transmitted; and
testing each of the one or more hypotheses to identify a correct hypothesis by descrambling the scrambled version of the block of data according to each hypothesis and using the error detection data to determine whether any errors are present in the descrambled block of data, wherein the correct hypothesis is one for which no errors are present in the descrambled block of data.

13. The method of claim 12, wherein the error detection data is received separately from the scrambled version of the block of data.

14. The method of claim 12, wherein the scrambled version of the block of data comprises the error detection data.

15. The method of claim 12, wherein the error detection data comprises a cyclic redundancy check code.

16. The method of claim 12, wherein generating the one or more hypotheses as to the scrambling sequence which has been applied to the channels on which the additional data has been transmitted comprises generating the one or more hypotheses for each of one or more distinct scrambling sequences, each distinct scrambling sequence being associated with a different value for the additional data.

17. The method of claim 16, wherein the scrambling sequence is associated with SS block time index indication by PBCH.

18. The method of claim 12, wherein generating one or more hypotheses as to the scrambling sequence which has been applied to the channels on which the additional data has been transmitted comprises generating a prediction of the additional data which has been transmitted and generating a scrambling sequence which comprises the predicted additional data.

19. The method of claim 18, wherein the prediction of the additional data is generated based on data which already known to a receiver, or the prediction of the additional data comprises a cell ID associated with a cell in a mobile network.

20. The method of claim 12, further comprising determining the additional data that has been transmitted based on the correct hypothesis of the scrambling sequence that has been applied to the channels on which the additional data has been transmitted.

* * * * *